United States Patent
Griebenow et al.

(10) Patent No.: US 8,735,237 B2
(45) Date of Patent: May 27, 2014

(54) METHOD FOR INCREASING PENETRATION DEPTH OF DRAIN AND SOURCE IMPLANTATION SPECIES FOR A GIVEN GATE HEIGHT

(75) Inventors: Uwe Griebenow, Markkleeberg (DE); Kai Frohberg, Niederau (DE); Frank Feustel, Dresden (DE); Thomas Werner, Friedewald (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/524,582

(22) Filed: Jun. 15, 2012

(65) Prior Publication Data
US 2012/0256240 A1    Oct. 11, 2012

Related U.S. Application Data

(62) Division of application No. 12/205,221, filed on Sep. 5, 2008.

(30) Foreign Application Priority Data

Feb. 29, 2008  (DE) .......................... 10 2008 011 932

(51) Int. Cl.
*H01L 21/336* (2006.01)
*H01L 29/10* (2006.01)

(52) U.S. Cl.
USPC ............... 438/198; 438/19; 438/51; 438/214; 438/285; 438/300; 257/288; 257/347; 257/408; 257/487; 257/E21.223; 257/E21.232; 257/E21.335; 257/E21.409

(58) Field of Classification Search
USPC .................. 438/19, 51, 198, 214, 285, 300; 257/288, 347, 408, 487, E21.223, 257/E21.232, E21.335, E21.409
See application file for complete search history.

(56) References Cited

U.S. PATENT DOCUMENTS

| | | | |
|---|---|---|---|
| 7,579,617 B2 * | 8/2009 | Shimamune et al. ........... | 257/19 |
| 7,601,983 B2 * | 10/2009 | Ueno et al. ....................... | 257/51 |
| 2006/0081930 A1 * | 4/2006 | Maegawa et al. .............. | 257/347 |
| 2007/0148893 A1 * | 6/2007 | Josiek et al. ................... | 438/370 |
| 2009/0001484 A1 * | 1/2009 | Feudel et al. .................. | 257/408 |
| 2009/0121258 A1 * | 5/2009 | Kumar ............................ | 257/192 |

FOREIGN PATENT DOCUMENTS

| | | | | |
|---|---|---|---|---|
| DE | 102004062829 A1 | 9/2005 | ............ | H01L 21/336 |
| WO | WO 2006/039641 A2 | 4/2006 | ............ | H01L 21/336 |

OTHER PUBLICATIONS

Translation of Official Communication from German Patent Office for German Patent Application No. 10 2008 011 932.6 dated Apr. 28, 2009.

* cited by examiner

*Primary Examiner* — Dao H Nguyen (57) ABSTRACT

The thickness of drain and source areas may be reduced by a cavity etch used for refilling the cavities with an appropriate semiconductor material, wherein, prior to the epitaxial growth, an implantation process may be performed so as to allow the formation of deep drain and source areas without contributing to unwanted channel doping for a given critical gate height. In other cases, the effective ion blocking length of the gate electrode structure may be enhanced by performing a tilted implantation step for incorporating deep drain and source regions.

22 Claims, 10 Drawing Sheets

METHOD FOR INCREASING PENETRATION DEPTH OF DRAIN AND SOURCE IMPLANTATION SPECIES FOR A GIVEN GATE HEIGHT

CROSS-REFERENCE TO RELATED APPLICATION

This is a divisional of co-pending application Ser. No. 12/205,221, filed Sep. 5, 2008.

BACKGROUND

1. Field of the Disclosure

The present disclosure generally relates to the fabrication of integrated circuits, and, more particularly, to the fabrication of highly sophisticated field effect transistors, such as MOS transistor structures having a gate electrode with a gate height that may be less than a junction depth of the deep drain and source regions.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are, and will be, based on silicon devices, due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, at least at the area in the vicinity of the channel region, i.e., source and drain extension regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence to obtain a high dopant concentration having a profile that varies laterally and in depth. The introduction of a high dose of dopants into a crystalline substrate area, however, generates heavy damage in the crystal structure and, therefore, one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile. A defined degree of blurring may be advantageous for defining critical transistor properties, such as the overlap between the extension regions and the gate electrode. In other areas of the drain and source regions, that is, in deeper lying portions, the diffusion may result in a reduction of the dopant concentration at the corresponding PN junction areas, thereby reducing the conductivity at the vicinity of theses areas. Thus, on the one hand, a high anneal temperature may be desirable in view of a high degree of dopant activation, re-crystallization of implantation-induced lattice damage and a desired diffusion at shallow areas of the extension regions, while, on the other hand, the duration of the anneal process should be short in order to restrict the degree of dopant diffusion in the deeper drain and source regions, which may reduce the dopant gradient at the respective PN junctions and also reduce the overall conductivity due to reducing the average dopant concentration. Therefore, for highly advanced transistors, the positioning, shaping and maintaining of a desired dopant profile are important properties for defining the final performance of the device, since the overall series resistance of the conductive path between the drain and source contacts may represent a dominant part for determining the transistor performance.

A further issue related to the lateral and vertical dopant profile of the drain and source regions, and thus of the PN junctions, may be presented by the overall capacitance of the PN junctions, which is roughly related to the effective interface formed by the PN junctions with respect to the remaining active region of the semiconductor device. In order to further enhance the performance of silicon-on-insulator (SOI) transistors, the parasitic capacitance of the PN junctions may be significantly reduced by designing the vertical dopant profile in such a manner that a high dopant concentration is obtained that extends down to the buried insulating layer. In this way, only the laterally oriented interface, i.e., the PN junction of the drain and source regions, contributes to the overall junction capacitance, while, additionally, the high dopant concentration extending down to the buried insulating layer provides the desired PN junction characteristics and also a reduced overall series resistance in the drain and source regions. However, providing deep drain and source regions with high dopant concentrations down to the buried insulating layer may require sophisticated implantation techniques, thereby contributing to the overall process complexity. In other cases, a moderately high dopant concentration at the buried insulating layer may be accomplished by adjusting the process parameters of the respective anneal processes in such a way that the diffusion of the dopants during the anneal process may result in the desired vertical dopant profile. The respective anneal parameters may, however, not be compatible with the requirement of a reduced transistor length, since a lateral diffusion, for instance in the extension regions, may also take place and result in a modified channel length, which may therefore require increased spacer widths to accommodate the increased diffusion activity during a respective anneal process. Thus, high temperature anneal processes with extended process times for inducing high diffusion activity and thus generating a high thermal budget may be a less attractive approach in view of increasing the packing density of sophisticated semiconductor devices.

Moreover, techniques have been recently developed in which the transistor performance, for instance the performance of P-channel transistors, may be significantly enhanced by providing a strained semiconductor material, such as a silicon/germanium compound, which may be formed in drain and source regions of silicon-based active transistor areas. The strained silicon/germanium compound, which may also be referred to as a silicon/germanium alloy, may be provided in a strained state due to a mismatch of the lattice spacing of natural silicon and natural silicon/germanium alloy. That is, the silicon/germanium material may be formed on the basis of the silicon lattice spacing, thereby resulting in a strained silicon/germanium crystal lattice, which may then interact with the neighboring semiconductor material to exert a stress and thus cause a certain strain. When providing the strained silicon/germanium alloy in the drain and source regions, the respective stress created by the strained material may act on the channel region of the transistor, thereby creating a respective compressive strain therein, which may enhance the charge carrier mobility therein. In highly scaled transistor devices based on the SOI architecture, significant benefits with respect to performance may be achieved by providing a highly strained semiconductor alloy in the vicinity of the channel region that extends along a significant portion in the depth direction in the semiconductor layer. Consequently, an efficient strain-inducing mechanism in SOI devices, in combination with a reduced parasitic junction capacitance, may result in an overall performance gain, while, additionally, a highly reduced thermal budget of the respective anneal processes may be desirable to provide the potential for reducing the lateral dimensions of the transistor devices, as explained above.

However, during further device scaling, for instance in the 45 nm MOSFET technology, the implant energy for forming the deep drain and source regions of SOI devices and of bulk devices is substantially limited by the ion blocking capability of the gate electrode since the thickness of the semiconductor layer and thus of the deep drain and source regions is comparable to the height of the gate electrode. Consequently, if a desired high dopant concentration is to be incorporated at a desired depth, for instance at the interface between the active semiconductor layer and the buried insulating layer in an SOI configuration, without using significant dopant diffusion, which may result in a reduced dopant concentration, as previously discussed, the channel region located below the gate electrode may also receive the dopant species, thereby significantly altering the transistor performance. That is, if the implant energy is selected moderately high so as to position the dopant species at a desired depth, for instance close to the silicon/silicon dioxide interface of an SOI transistor, the polysilicon gate electrode may not efficiently block the implant species, thereby resulting in an undesired doping of the channel region. On the other hand, adjusting the implant energy with respect to the ion blocking capability of the gate electrode may result in a reduced depth of the deep drain and source areas, which may result in SOI techniques in increased junction capacitance, which may also translate into a reduced transistor performance.

The present disclosure is directed to various methods that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to techniques for forming deep drain and source regions for advanced transistor devices, in which gate electrode height may be comparable to the average penetration depth required for the formation of deep drain and source areas, in particular for P-channel transistors in which the dopant distribution of the P-type dopant species may result in undesired channel doping when positioning a moderately high dopant concentration at a per se desired depth in the drain and source areas. For this purpose, in some illustrative aspects disclosed herein, the effective ion blocking capability of the gate electrode with respect to the position of the deep drain and source regions may be "adjusted" prior to the implantation process, which may be accomplished in some aspects by removing a material of the drain and source areas prior to actually implanting the dopant species, thereby increasing the ratio of the gate height with respect to material thickness in the drain and source areas. After the implantation process, additional semiconductor material may be deposited to obtain a desired height of the drain and source areas, wherein the respective semiconductor material may, in some illustrative aspects, also be used for further enhancement of transistor characteristics, such as the charge carrier mobility in the channel region. In still other illustrative aspects disclosed herein, the effective ion blocking capability of the gate electrode may be increased by performing a tilted implantation step, while also using the different nature of the substantially crystalline material in the drain and source areas and the polycrystalline material in the gate electrode. Consequently, the effective penetration depth of the dopant species in the drain and source areas may be increased for a given gate electrode height, thereby resulting in enhanced overall transistor performance.

One illustrative method disclosed herein comprises forming cavities in a semiconductor region adjacent to a gate electrode structure of a transistor. The method further comprises implanting a dopant species into the cavities in order to define deep drain and source areas of the transistor. Additionally, the method comprises forming a semiconductor material in the cavities and forming drain and source regions of the transistor, wherein the drain and source regions comprise the deep drain and source areas.

A further illustrative method disclosed herein comprises forming a drain mask above a drain region of a transistor so as to cover the drain region and expose a source region. The method additionally comprises performing a source implantation process to implant a dopant species into the source region of the transistor by using the drain mask and a gate electrode as an implantation mask, wherein the source implantation process comprises at least one implantation step using a tilt angle. The method further comprises forming a source mask above the source region so as to cover the source region and expose the drain region. Finally, the method comprises performing a drain implantation process to implant the dopant species into the drain region by using the source mask and the gate electrode as an implantation mask, wherein the drain implantation process comprises at least one implantation step using a tilt angle.

A still further illustrative method disclosed herein comprises forming drain and source extension regions in a semiconductor layer adjacent to a gate electrode structure of a P-channel transistor. Moreover, the method comprises increasing the shielding effect of the gate electrode with respect to an implantation process for forming deep drain and source regions of the P-channel transistor. Additionally, the method comprises introducing a P-type dopant into the semiconductor layer using the gate electrode as an implantation mask for substantially avoiding penetration of the P-type dopant into a channel region of the transistor.

BRIEF DESCRIPTION OF THE DRAWINGS

The disclosure may be understood by reference to the following description taken in conjunction with the accompanying drawings, in which like reference numerals identify like elements, and in which:

FIGS. 1j-1n schematically illustrate cross-sectional views of a semiconductor device including transistors of different conductivity type during various manufacturing stages in forming deep drain and source regions on the basis of a material removal prior to a deep drain and source implantation process, according to further illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of reduced ion blocking capability of gate electrode structures in sophisticated transistor devices, where a desired depth of the deep drain and source areas may be comparable to the height of the gate electrode structure. As previously indicated, in particular, advanced SOI transistors may suffer from a significant reduction of performance when a desired high dopant concentration may not be positioned at the interface between the active silicon layer and the buried insulating layer, which may result in increased junction capacitance. For example, in P-channel transistors, the high dose implantation process required for the deep drain and source areas may result in a relatively pronounced depth distribution of the dopant concentration, which may thus also require a significant reduction of the implant energy in order to maintain an undesired dopant concentration in the channel region at an acceptable level. Consequently, a reduced dopant concentration may also be obtained at the desired depth, for instance at the buried insulating layer, thereby, in particular, reducing performance of P-channel transistors. With further device scaling, a further reduction in gate height may be necessary, thereby also rendering the implantation conditions for N-channel transistors less efficient with respect to positioning the N-type dopant at a desired depth so that, in total, performance of N-channel transistors and P-channel transistors may be negatively affected in advanced approaches, for instance in the 45 nm technology node and beyond. Since, in many cases, increasing the gate height may not be considered a viable approach, for instance in view of the resulting topography, the present disclosure relates to techniques in which the effective blocking capability of the gate electrode structure may be increased by temporarily removing material from the drain and source areas and/or by increasing the effective gate height during a tilted implantation process, while appropriately covering portions of the transistor area and taking advantage of the crystalline nature of the drain and source areas compared to the polycrystalline configuration of the gate electrode structure.

For example, in some illustrative embodiments, the temporary removal of material in the drain and source areas may be advantageously combined with a subsequent refill of the resulting cavities after the implantation process in that the newly formed semiconductor material may have characteristics to enhance the overall transistor performance. For example, as previously explained, the strain level in the channel region of transistors may be frequently adjusted on the basis of a strain-inducing semiconductor material in the drain and source areas, such as a silicon/germanium alloy, a silicon/carbon alloy and the like, so that the corresponding cavity etch process may also provide the desired transistor configuration for introducing a dopant species into the deep drain and source areas with a reduced implantation energy, thereby substantially avoiding any undue positioning of the dopant species within the channel region, since, due to the reduced implantation energy required, the ion blocking capability of the gate electrode may reliably stop the introduced dopant species. In this manner, increased depth of the deep drain and source areas may be obtained in combination with an overall enhanced charge carrier mobility in the channel region. Thus, the principles disclosed herein may be advantageous in the context of sophisticated SOI devices, since the deep drain and source areas may be formed down to the buried insulating layer with a moderately high dopant concentration. However, the embodiments disclosed herein may also be applied to a bulk configuration, thereby also enabling an increase of the drain and source regions, which may result in increased drive current capability. Consequently, principles disclosed herein should not be considered as being restricted to a specific transistor architecture, unless such restrictions are specifically set forth in the appended claims and/or in the specification.

Figure 1A:
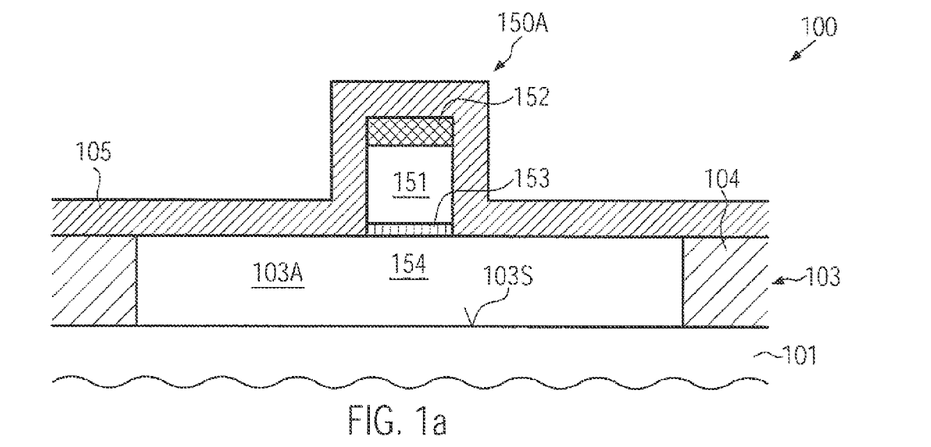
FIGS. 1a-1i schematically illustrate cross-sectional views of a semiconductor device including a transistor element during various manufacturing stages in forming deep drain and source regions down to a desired depth while also respecting the ion blocking capability of the gate electrode structure by selectively removing material of the drain and source areas prior to a deep drain and source implantation process, according to illustrative embodiments.

FIG. 1a schematically illustrates a cross-sectional view of a semiconductor device 100 comprising a substrate 101 which may represent any appropriate carrier material for forming thereabove a semiconductor layer 103, such as a silicon-containing semiconductor layer or any other appropriate semiconductor material for forming therein and thereabove circuit elements, such as a transistor 150A. In this context, a silicon-based semiconductor layer, such as the layer 103, is to be understood as a semiconductor material comprising silicon, possibly in combination with other species, such as germanium, carbon and the like, in the manufacturing stage shown or in a later manufacturing stage, wherein, nevertheless, a significant amount of silicon may be present. Moreover, in some illustrative embodiments (not shown in FIG. 1a), a buried insulating layer may be provided, as will, for instance, be described with reference to FIG. 1i, to define an SOI configuration in which the semiconductor layer 103 may be isolated in the vertical direction by the buried insulating layer.

In this context, it should be noted that any positional information, such as "horizontal," "vertical," "above," "lateral" and the like, are to be understood as relative positional information, wherein a prominent layer or interface or surface of the semiconductor device 100 is to be used as a reference. For example, a surface 103S forming an interface between the layer 103 and the substrate 101 may act as a reference plane when a pronounced interface may be formed between the layer 103 and the substrate 101, as is the case in an SOI configuration.

The semiconductor layer 103 may comprise a plurality of insulation structures 104, such as shallow trench isolations and the like, thereby defining respective active regions in which the conductivity of the semiconductor material may have to be "patterned" in any appropriate manner to form circuit elements, such as transistor areas including PN junctions and the like. Furthermore, in the manufacturing stage shown, the transistor 150A, which may represent a P-channel transistor or an N-channel transistor, may comprise a gate electrode 151 which, in some illustrative embodiments, may have a gate length, i.e., in FIG. 1a, the horizontal extension of the gate electrode 151, of approximately 50 nm and less. The gate electrode 151 may be separated from a channel region 154 by a gate insulation layer 153, which may be provided in the form of a silicon dioxide material, silicon nitride, silicon oxynitride, high-k dielectric materials and the like. It should be appreciated that the principles disclosed herein may be highly advantageous in the context of the transistor 150A having a gate length in the above-specified range, since, here, pronounced dopant profiles at the PN junctions are required, while the degree of dopant activation and the charge carrier mobility in the channel region 154 may also be important aspects in view of the reduction of the overall series resistance of the transistor 150A.

Furthermore, as illustrated, a mask layer 105 may be provided, for instance, in the form of a silicon nitride layer or any other appropriate dielectric material which may act as a growth mask in a later manufacturing stage.

The semiconductor device 100 as shown in FIG. 1a may be formed on the basis of the following processes. The isolation structures 104 may be formed on the basis of well-established patterning strategies involving photolithography and etch techniques, followed by an appropriate deposition of a dielectric material. Thereafter, the resulting surface topography may be planarized, for instance, by chemical mechanical polishing (CMP) and the like. Next, the gate electrode 151 and the gate insulation layer 153 may be formed on the basis of sophisticated processes wherein a height of the gate electrode 151 may be adjusted in accordance with the overall device requirements and the corresponding design rules. During the gate patterning process, the cap layer 152 may also be provided with a thickness that is compatible with the overall manufacturing flow. As previously explained, in sophisticated applications, the height of the gate electrode 151 including the cap layer 152 may be comparable to a thickness of the semiconductor layer 103. Next, the mask layer 105 may be formed, for instance, on the basis of plasma assisted or thermally activated chemical vapor deposition (CVD), wherein a thickness of the mask layer 105 may be selected in view of a desired offset of cavities to be formed in the layer 103 in a later manufacturing stage.

Figure 1B:
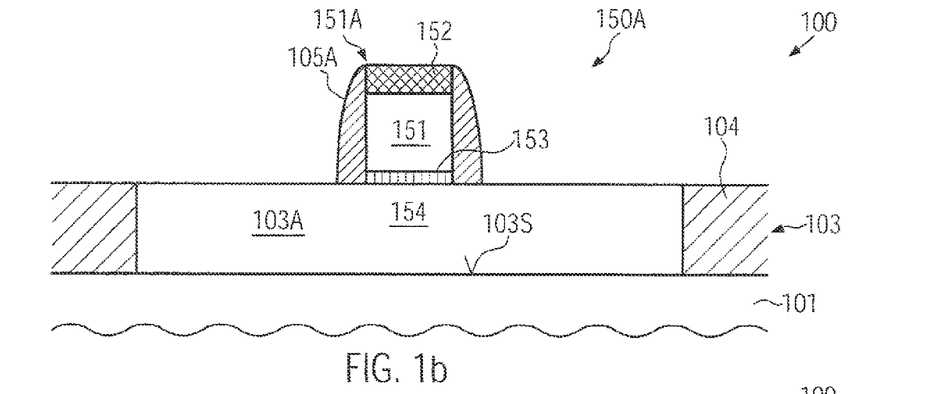

FIG. 1b schematically illustrates the semiconductor device 100 in a further advanced manufacturing stage in which an anisotropic etch process may have been performed for selectively etching material of the mask layer 105 with respect to the semiconductor layer 103 or with respect to a corresponding etch stop liner (not shown) which may optionally be formed prior to the deposition of the mask layer 105. Thus, a spacer element 105A may be formed on sidewalls of the gate electrode 151, thereby defining a gate electrode structure 151A in which the gate electrode 151 may be completely encapsulated by the spacer 105A and the cap layer 152.

Figure 1C:
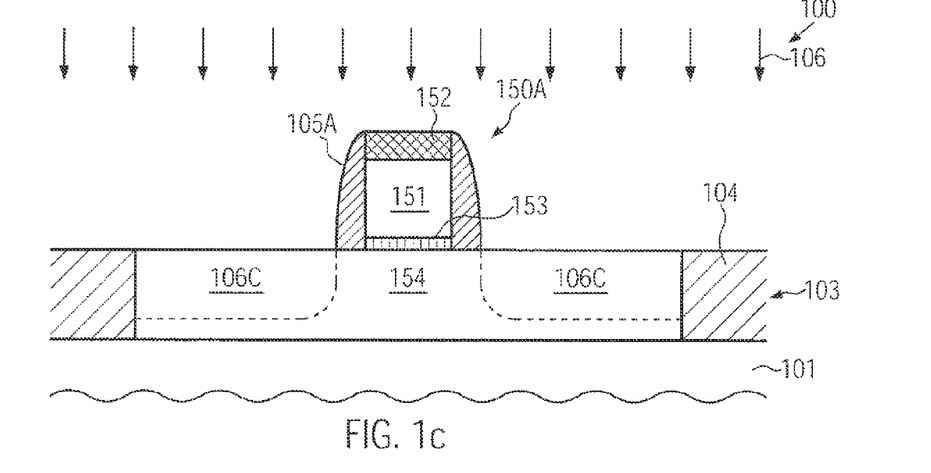

FIG. 1c schematically illustrates the semiconductor device 100 during a cavity etch process 106, which is performed based on a selective etch chemistry in order to remove material of the layer 103 selectively to the material of the spacer 105A and the cap layer 152 as well as the isolation structure 104. For this purpose, well-established selective etch recipes may be used.

Figure 1D:
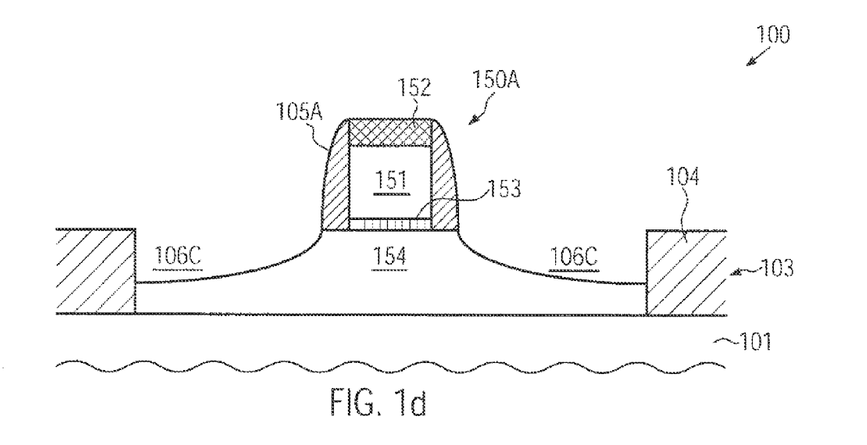

FIG. 1d schematically illustrates the semiconductor device 100 after the etch process 106 and after the removal of any resist masks that may possibly be used to cover other device areas, if required. Hence, the cavities 106C may be formed adjacent to the gate electrode structure 151A, wherein, in one illustrative embodiment, the shape and depth of the cavities 106C may be selected so as to be compatible with the further processing in view of refilling the cavities 106C with a strain-inducing material, such as a silicon/germanium alloy, wherein the lateral and vertical size of the cavities 106C, in combination with the composition of the strain-inducing semiconductor material, may substantially determine the finally obtained strain level in the channel region 154. In other illustrative embodiments, the width of the spacer element 105A may be selected in view of a desired offset of deep drain and source areas to be formed through the cavities 106C, while the process parameters of the etch process 106, that is, the degree of isotropic behavior, may be selected so as to position a semiconductor material still to be formed in the cavities 106C more closely to the channel region 154. In still other illustrative embodiments, the cavities 106C may be formed in view of providing a reduced material thickness for forming deep drain and source areas without requiring the consideration of other aspects, such as strain-inducing mechanisms and the like.

Figure 1E:
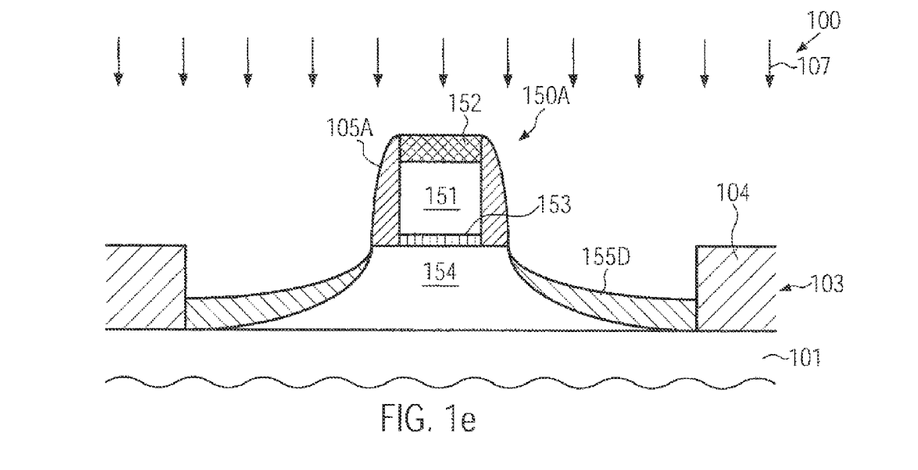

FIG. 1e schematically illustrates the semiconductor device 100 during an implantation process 107, which is designed to incorporate a dopant species, for instance, a P-type dopant species when the transistor 150A represents a P-channel transistor or an N-type dopant species when the transistor 150A represents an N-channel transistor. The implantation process 107 may be performed on the basis of appropriately selected process parameters, such as implantation energy and implantation dose, so as to form deep drain and source regions 155D which may extend down to a specified depth which may be represented, in some illustrative embodiments, by an interface of the semiconductor layer 103 and a buried insulating layer (not shown). During the implantation process 107, a reduced implantation energy may be used compared to conventional strategies in which deep drain and source regions may typically be formed on the basis of the original thickness of the semiconductor layer 103, thereby substantially suppressing any incorporation of the dopant species into the channel region 154, since the gate electrode structure 151A may provide the required ion blocking capability.

Figure 1F:
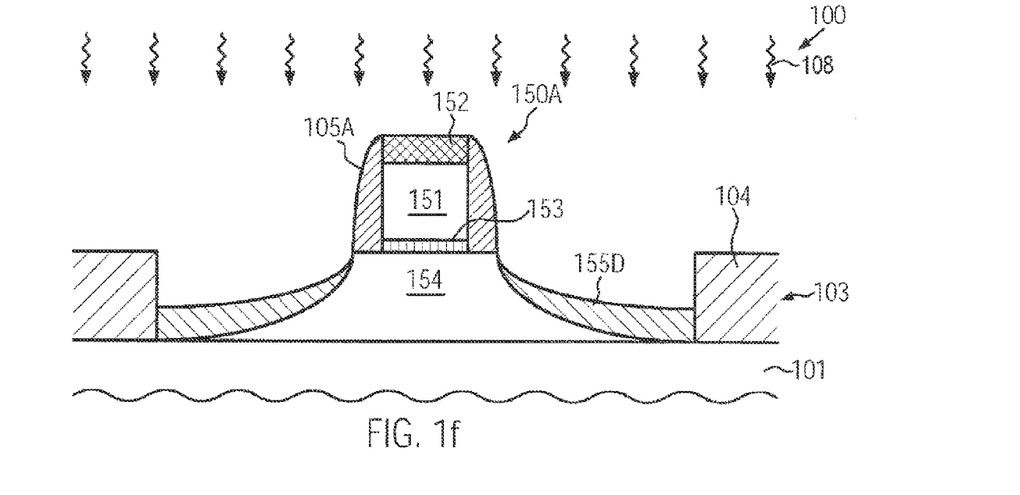

FIG. 1f schematically illustrates the semiconductor device 100 according to one illustrative embodiment in which, if desired, an optional anneal process 108 may be performed to re-crystallize any implantation-induced damage in order to provide superior surface conditions for a subsequent selective epitaxial growth process. For this purpose, any appropriate anneal technique, such as laser-based and flash-based techniques, rapid thermal anneal processes and the like, may be used. In other illustrative embodiments, when implantation-induced damage is considered acceptable for the further processing, the anneal process 108 may be omitted. Next, a selective epitaxial growth process may be performed to refill the cavities 106C by an appropriate semiconductor material which may, in one illustrative embodiment, be substantially the same material as the original material of the semiconductor layer 103, while, in other illustrative embodiments, a different semiconductor material may be used so as to adjust the overall transistor characteristics. For example, silicon/germanium material, silicon/carbon material and the like may be used in any appropriate composition to modify the lattice structure in the adjacent channel region 154 so as to create a desired strain level therein. For instance, if the transistor 150A represents a P-channel transistor, well-established selective epitaxial growth techniques for forming a silicon/germanium alloy may be used to refill the cavities 106C up to a desired height level with a strained silicon/germanium material, since, upon re-growing the material, it may take on substantially the lattice structure and thus lattice constant of the material of the layer 103, which may act as a template for the growth process.

Figure 1G:
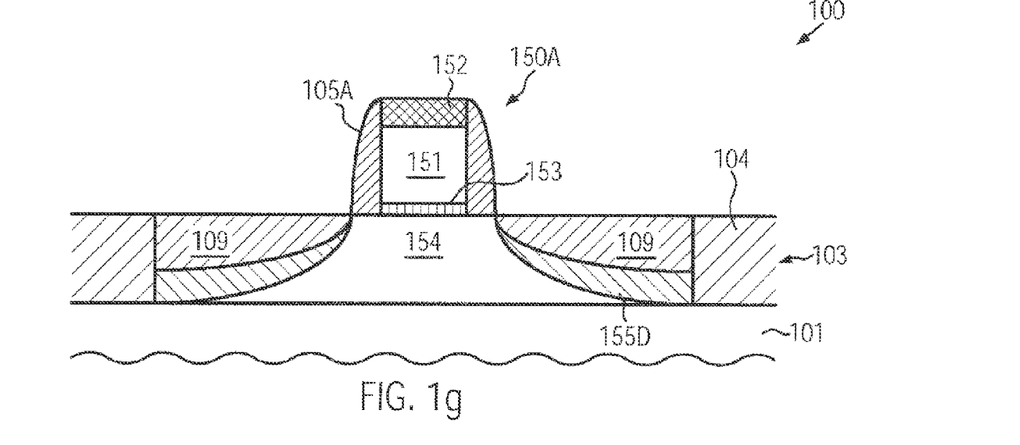

FIG. 1g schematically illustrates the semiconductor device 100 after the above-described selective epitaxial growth process. Consequently, a re-grown semiconductor material 109, for instance, a silicon/germanium material, a silicon/carbon material, a silicon material and the like, may be provided in a doped or non-doped condition, depending on the overall process and device requirements. It should be appreciated that the semiconductor material 109 may be provided in an "underfilled," an "overfilled" or a substantially planar state, as is, for instance, shown in FIG. 1g.

Figure 1H:
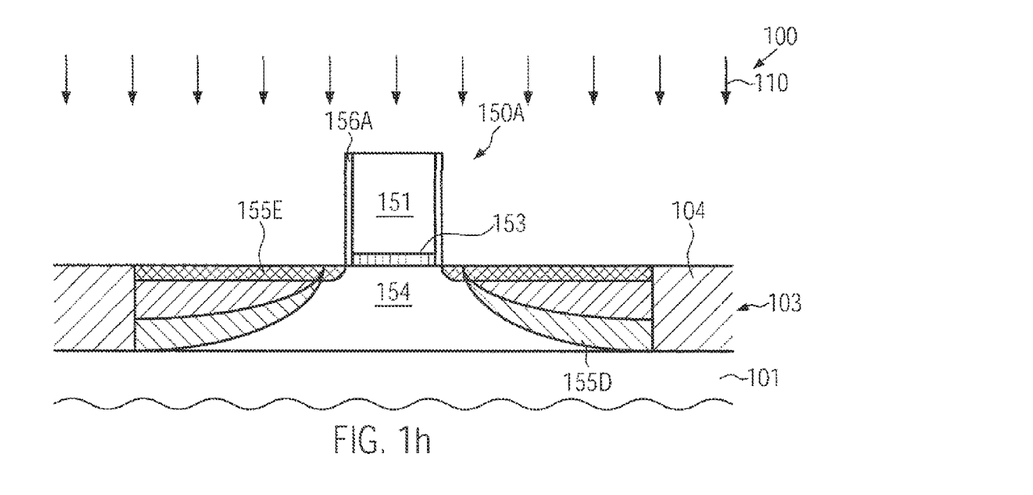

FIG. 1h schematically illustrates the semiconductor device 100 in a further advanced manufacturing stage in which the spacer element 105A may be removed and, if required, an appropriately selected offset spacer element 156A may be formed on sidewalls of the gate electrode 151. The offset spacer 156A may be formed in accordance with well-established process techniques with a thickness as may be required for forming drain and source extension regions 155E during a respective implantation process 110. For this purpose, any appropriate process parameters, such as dose and energy of the process 110, may be selected so as to obtain the desired dopant concentration and penetration depth for the extension regions 155E. It should be appreciated that, in other illustrative embodiments, the extension regions 155E may be formed in an earlier manufacturing stage, for example, prior to forming the mask layer 105 (FIG. 1a), wherein a portion thereof may then be removed during the etch process 106 (FIG. 1c), as previously explained. In some illustrative embodiments, after forming the extension regions 155E in an early manufacturing stage, the mask layer 105 may be provided in such a form that the spacer element 105A may also act as a further implantation mask during the further processing of the device 100, without requiring the removal of the spacer 105A. For example, the semiconductor material 109 may be provided in a highly doped state as may be required for defining drain and source regions, thereby avoiding any additional implantation processes and thus damage of the epitaxially formed semiconductor material 109 in the further processing. In other illustrative embodiments, a further spacer structure may be formed to enable further implantation processes, if a highly complex lateral dopant profile may be desired for the drain and source regions of the transistor 150A.

Figure 1I:
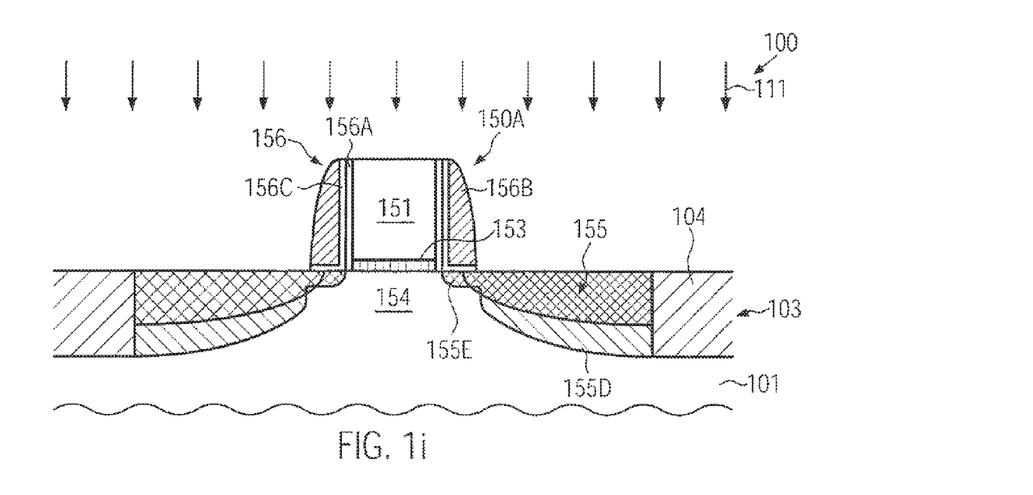

FIG. 1i schematically illustrates the semiconductor device 100 in a further advanced manufacturing stage according to illustrative embodiments in which a spacer structure 156 may comprise two or more individual spacer elements, such as the offset spacer 156A and one or more further spacers 156B as may be required for the definition of the lateral dopant profile. Furthermore, in the manufacturing stage shown, an implantation process 111 may be performed to further incorporate the dopant species for forming drain and source regions 155, which may include the extension regions 155E and the deep drain and source areas 155D. The spacer structure 156 may be formed on the basis of well-established techniques by depositing an appropriate liner material 156C, such as a silicon dioxide material, followed by the deposition of a spacer material, such as silicon nitride, which may subsequently be etched so as to obtain the spacer element 156B. Based on the spacer structure 156, the implantation process 111 may be performed; however, the implantation energy may be restricted with respect to the ion stopping capability of the gate electrode 151, since enhanced implantation energies may not be required as the deep drain and source areas 155D are already provided. Thus, during the implantation process 111, an unwanted penetration of dopant species into the channel region 154 may be substantially avoided or at least be significantly reduced compared to conventional strategies. It should be appreciated that a further spacer element may be formed and a further implantation process may follow if a more pronounced lateral dopant profile may be required.

Thereafter, the further processing may be continued by reducing the width of the spacer structure 156, if desired, and providing a metal silicide in the drain and source regions 155, as well as in the gate electrode 151, if required. Next, an appropriate interlayer dielectric material, for example, including a highly stressed dielectric material, may be deposited and may be patterned to form appropriate contact elements to one or more areas of the transistor 150A, in accordance with well-established process techniques.

As a consequence, the drain and source regions 155 may be formed so as to extend to a desired depth as defined by the deep drain and source areas 155D substantially without creating an undue doping within the channel region 154 due to the early incorporation of the dopant species for the deep drain and source areas 155D. In particular, in an SOI configuration, the deep drain and source areas 155D may extend down to the buried insulating layer with a high dopant concentration, thereby providing a reduced junction capacitance. If the transistor 150A represents a P-channel transistor, the above-described principles may be highly advantageous since, in this case, significant incorporation of dopants may occur according to conventional techniques due to pronounced variability of penetration depth of the P-type dopant species. Furthermore, in this case, the provision of a strained silicon/germanium alloy in the form of the material 109 (FIG. 1g) may be accomplished without adding significant additional process complexity, except for the implantation process 107 (FIG. 1e). In other illustrative embodiments, the transistor 150A may represent an N-channel transistor wherein the semiconductor material 109 may be provided as a silicon material if a strain-inducing mechanism may not be desired or the material 109 may be provided in the form of a silicon/carbon mixture.

With reference to FIGS. 1j-1n, further illustrative embodiments will now be described in which an early deep drain and source implantation process may be performed for transistors of different conductivity type.

Figure 1J:
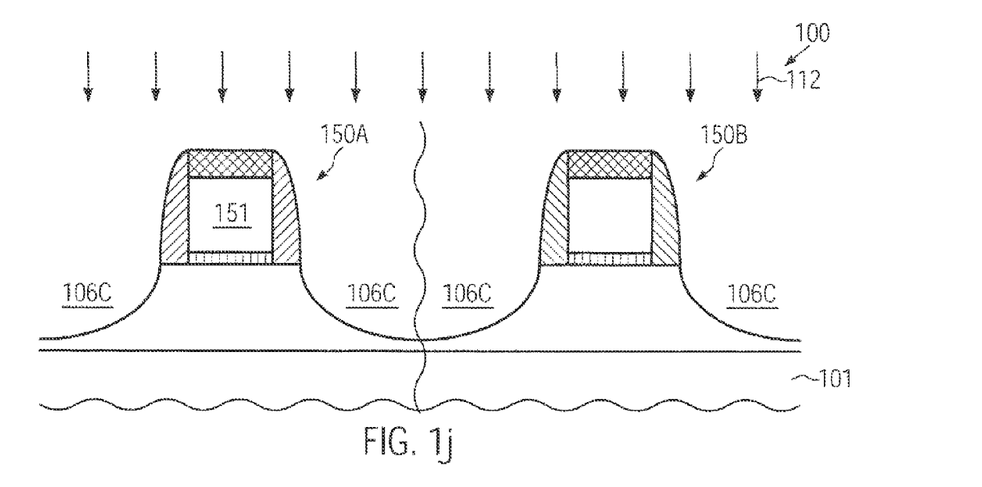

FIG. 1j schematically illustrates the semiconductor device 100 which may comprise a transistor 150A, which may represent an N-channel transistor, and which may also comprise a second transistor 150B, which may represent a P-channel transistor. In the embodiment shown in FIG. 1j, the cavity etch process 106 (FIG. 1c) may have been performed for both transistors 150A, 150B, thereby obtaining the cavities 106C. Forming the cavities 106C for both transistor types 150A, 150B in a common etch process may provide enhanced etch uniformity, for instance, with respect to micro loading effects and the like. Micro loading may refer to a situation in which the etch rate may depend on "pattern density" of respective device features that have to be etched within a specific area. That is, since both types of transistors may be exposed to the etch ambient, thereby avoiding the coverage of significant device areas, a similar "pattern density" for the cavities 106C may be established across the entire substrate 101, which may result in enhanced uniformity of the characteristics of the cavities 106C at different device regions. In other illustrative embodiments, the cavities 106C of the transistors 150A, 150B may be formed in different etch steps. Furthermore, the device 100 may be subjected to a deposition process 112 for forming an appropriate dielectric material, such as silicon dioxide and the like. For this purpose, the process 112 may be performed on the basis of well-established deposition techniques, such as plasma enhanced deposition and the like.

Figure 1K:
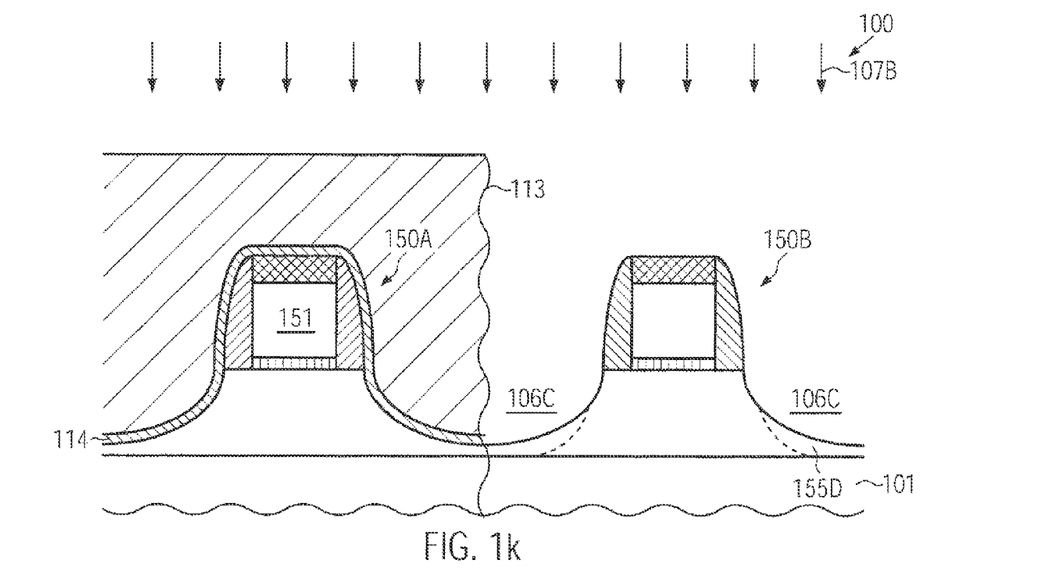

FIG. 1k schematically illustrates the semiconductor device 100 in a further advanced manufacturing stage. As illustrated, a dielectric layer 114, such as a silicon dioxide layer, may be selectively formed above the transistor 150A, while the transistor 150B may be exposed. Furthermore, a mask 113, such as a resist mask, may be formed to cover the transistor 150A and expose the transistor 150B. The mask 113 may be formed on the basis of well-established lithography techniques, as may typically be used for incorporating different types of dopants for P-channel transistors and N-channel transistors. Moreover, based on the mask 113, an unwanted portion of the dielectric layer 114, previously deposited by the process 112, may be removed from the transistor 150B on the basis of any appropriate selective etch recipe, for instance, for selectively removing silicon dioxide with respect to silicon and silicon nitride. Furthermore, prior to or after the selective removal of the unwanted portion of the layer 114, an implantation process 107B may be performed to introduce a dopant species, such as a P-type species, into the cavities 106C of the transistor 150B, similarly as previously explained with reference to the implantation process 107 (FIG. 1e). For example, if the implantation process 107B may be performed in the presence of the material 114, slightly higher implantation energy compared to the process 107 may have to be used.

FIG. 1l schematically illustrates the semiconductor device 100 in a further advanced manufacturing stage. As shown, the transistor 150B may have formed in the cavities 106C a semiconductor material 109B of any appropriate composition, such as a silicon/germanium material if the transistor 150B represents a p-channel transistor. In other cases, a silicon material may be used if a strain-inducing mechanism may not be desired. Furthermore, a dielectric layer 115 may be formed above the transistors 150A, 150B so as to confine the previously formed semiconductor material 109B in the transistor 150B. For instance, the layer 115 may have the same material composition as the layer 114, while in other cases any other material composition may be used.

The semiconductor device 100 as shown in FIG. 1l may be formed on the basis of the following processes. After the implantation process 107B for incorporating the dopant species in order to provide the deep drain and source areas 155D (see FIG. 1k), the mask 113 may be removed, for instance, by well-established plasma assisted removal processes and a selective epitaxial growth process may be performed wherein the layer 114 may act as a growth mask for substantially avoiding undue material deposition above the transistor 150A. After growing the material 109B up to any desired height level, the layer 115 may be deposited, for instance, by plasma enhanced CVD and the like. In other cases, an oxidation process may be performed to selectively oxidize exposed surface portions of the material 109B.

Figure 1M:
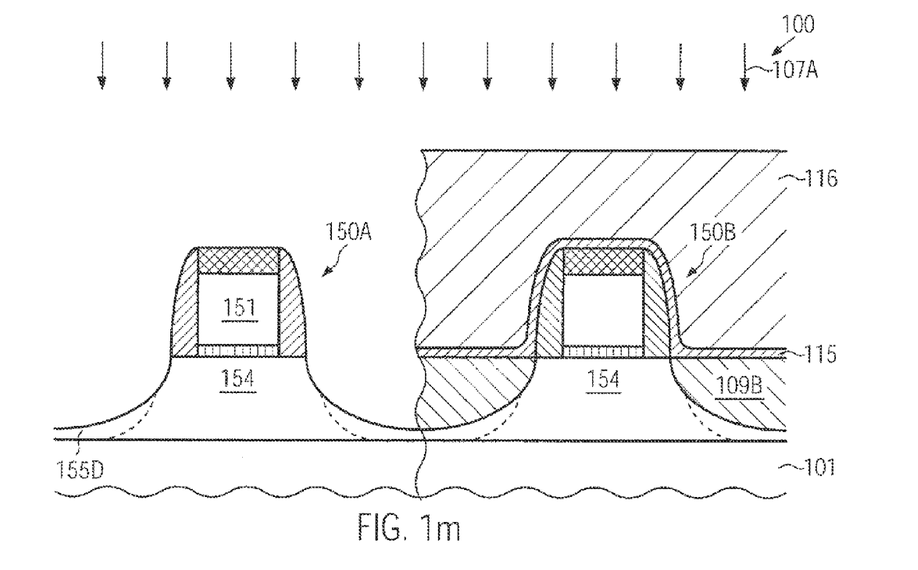

FIG. 1m schematically illustrates the semiconductor device 100 in a further advanced manufacturing stage in which a mask 116 is provided to cover the transistor 150B and expose the transistor 150A. For example, the mask 116 may be provided in the form of a resist material. The mask 116 may be formed on the basis of lithography techniques which are typically required for providing complementary transistors in advanced CMOS techniques. Furthermore, in one illustrative embodiment, the mask 116 may be used as an etch mask for selectively removing the materials 115 and 114 in the transistor 150A and performing an implantation process 107A to incorporate a dopant species for forming the deep drain and source areas 155D in the transistor 150A. For example, if representing an N-channel transistor, an N-type dopant may be incorporated. In other illustrative embodiments, if etch damage of the mask may be considered inappropriate, the implantation process 107A may be performed prior to removing the materials 114, 115, while appropriately adjusting implantation parameters. Since the combined layer thickness of the materials 114 and 115 may still be significantly less compared to the depth of cavities 106C, the ion stopping capability of the electrode structure 151A may still be sufficient for substantially avoiding undue doping of the channel region 154 in this case. Thereafter, the layers 115, 114 may be removed on the basis of the mask 116. Finally, the mask 116 may be removed on the basis of plasma assisted techniques, wet chemical etch recipes and the like.

Figure 1N:
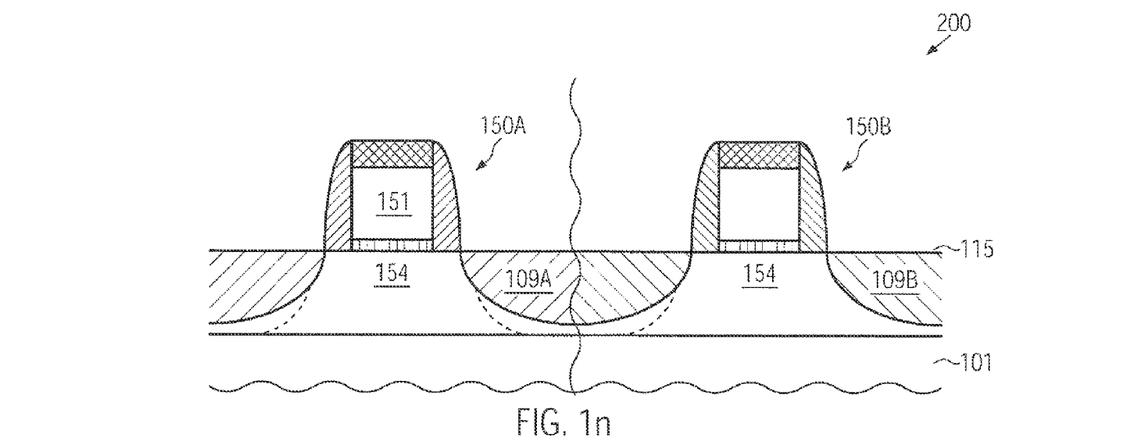

FIG. 1n schematically illustrates the semiconductor device 100 in a further advanced manufacturing stage in which a semiconductor material 109A may be formed in the drain and source areas of the transistor 150A, which may be accomplished on the basis of a selective epitaxial growth process, wherein the layer 115 above the transistor 150B may act as a growth mask. Thus, any appropriate material composition for the semiconductor material 109A may be selected, for instance, in view of creating strain in the channel region 154 or obtaining a desired final height of the drain and source regions when a strain-inducing mechanism may not be required. The further processing of the device 100 may then be continued, as previously explained with reference to FIGS. 1h-1i.

It should be appreciated that other masking regimes may be used for selectively forming the materials 109A, 109B and also incorporating the required dopant species into the respective deep drain and source areas 155D. In the above-described process sequence, conventional lithography steps may be used for providing respective growth masks and selectively introducing the dopant species, thereby avoiding additional lithography processes. Consequently, process complexity and cycle time may be maintained at a low level.

Consequently, a high degree of flexibility may be obtained in combining strain-inducing mechanisms with the formation of deep drain and source areas for transistors of different conductivity type while not unduly contributing to overall process complexity.

With reference to FIGS. 2a-2f, further illustrative embodiments will now be described in more detail in which the shielding effect of a gate electrode structure may be increased by using an implantation process including a tilted implantation step.

Figure 2A:
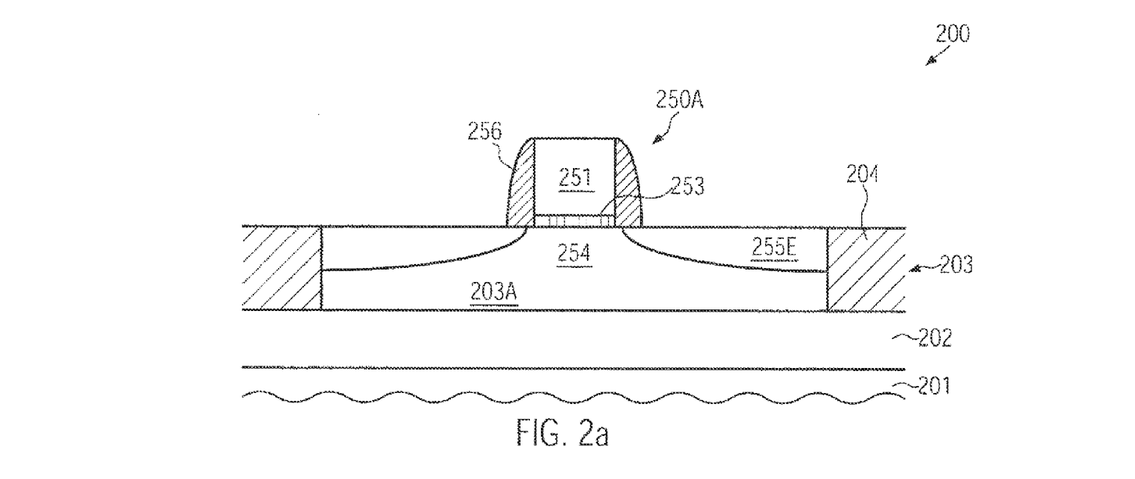
FIGS. 2a-2g schematically illustrate cross-sectional views of a semiconductor device during various manufacturing stages in forming deep drain and source regions wherein the effective blocking capability of a gate electrode structure may be increased by forming the deep drain and source regions on the basis of a tilted implantation step, according to still further illustrative embodiments.

FIG. 2a schematically illustrates a cross-sectional view of a semiconductor device 200 comprising a substrate 201, a buried insulating layer 202 and a semiconductor layer 203. Furthermore, a transistor 250A may be formed in and above an active region 203A that may be defined by trench isolation structures 204. Furthermore, the transistor 250A comprises a gate electrode 251, a gate insulation layer 253 and a channel region 254. Furthermore, in the manufacturing stage shown, an extension region 255E may be formed adjacent to the channel region 254. With respect to the components described so far, the same criteria apply as previously explained with reference to the semiconductor device 100. In particular, the buried insulating layer 202 may be omitted if a bulk configuration for the transistor 250A is considered. Moreover, the device 200 may comprise a spacer structure 256 formed on sidewalls of the gate electrodes 251, which may have an appropriate configuration for the subsequent implantation processes for forming deep drain and source regions.

Figure 2B:
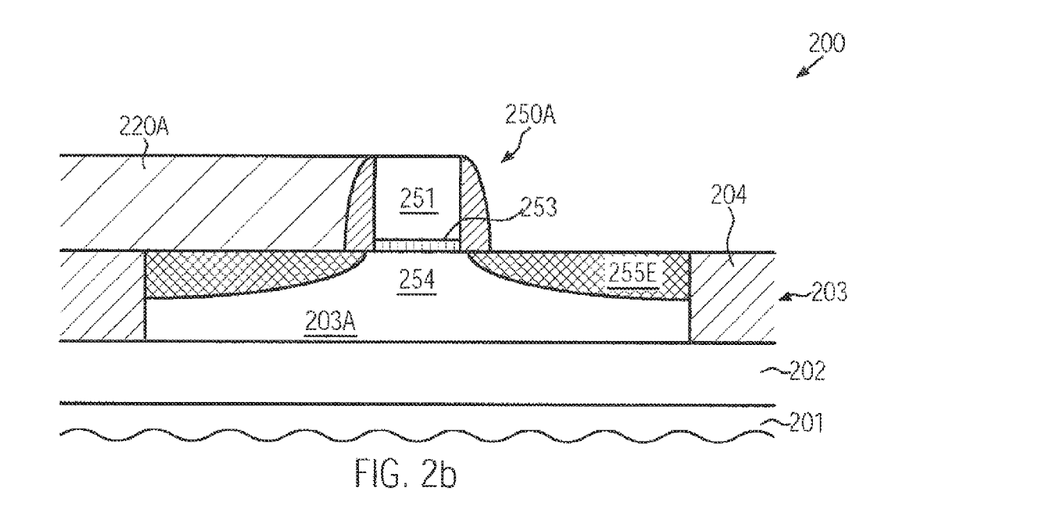

FIG. 2b schematically illustrates the semiconductor device 200 in an advanced manufacturing stage in which a mask 220A may cover the drain area or the source area of the transistor 250A. It should be appreciated that the terms "drain" and "source" may be interchanged if a substantially symmetric configuration of the transistor 250A may be considered. In other cases, when an asymmetric transistor configuration is to be established for the transistor 250A, the drain and source areas may have a different configuration. However, for the further processing, it may be assumed that the mask 220A may cover the drain area and may therefore be referred to as a drain mask, while it should be appreciated that, in another case, the mask 220A may cover the source area of the transistor 250A. The mask 220A may be comprised of any appropriate material having ion stopping capabilities that are at least comparable with that of the gate electrode 251. For example, a resist material, a polymer material and the like may be used. In other cases, the mask 220A may be formed of silicon dioxide and the like. The mask 220A may be formed by depositing the mask material by any appropriate deposition technique, for instance spin-on, CVD and the like, possibly followed by an appropriately designed planarization step, if required. By means of a lithography step, a non-desired portion of the mask material may be removed where alignment accuracy of the process may be restricted to a process margin that is substantially defined by the width of the gate electrode structure 251. That is, an alignment error of approximately one half of the gate electrode length may be acceptable so as to obtain a reliable asymmetric coverage of one of the drain and source regions by the mask 220A.

Figure 2C:
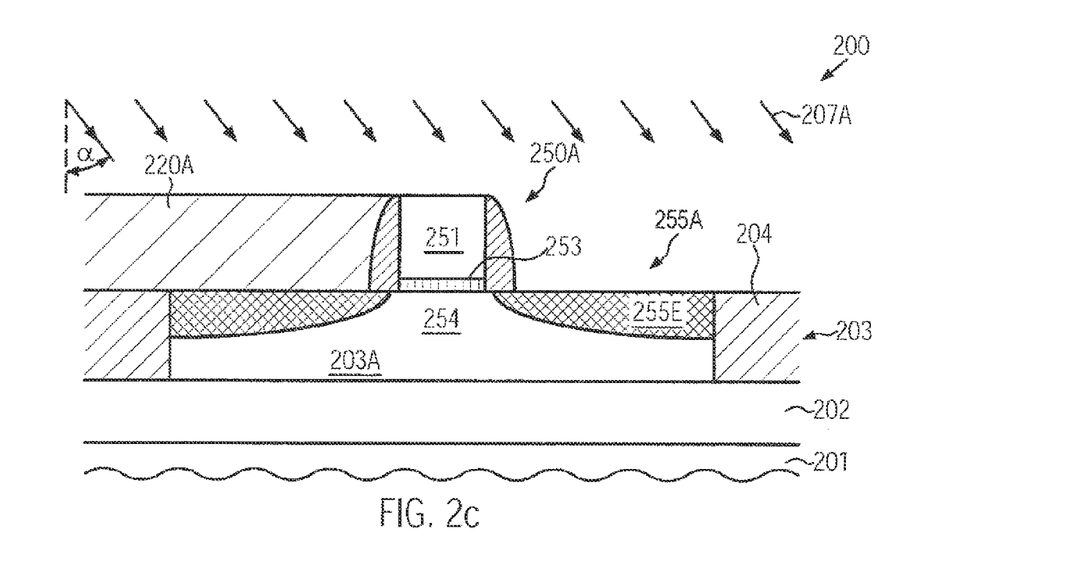

FIG. 2c schematically illustrates the device 200 during a first implantation process 207A for asymmetrically introducing dopant species into a source area 255A, wherein the implantation process 207A may comprise at least one implantation step performed on the basis of a tilt angle. That is, a beam of incident ions may arrive under an angle $\alpha$ with respect to a direction substantially perpendicular to the surface of the semiconductor layer 203. For example, in the arrangement shown in FIG. 2c, the tilt angle $\alpha$ may be assumed to have a positive sign and an absolute amount in the range of approximately 35-45 degrees. Due to the tilt angle $\alpha$, the effective length for stopping the ions of the implantation process 207A may be increased by a factor of $1/\cos \alpha$, which may therefore substantially reduce the probability of doping the channel region 254 for a given implantation energy. On the other hand, the incoming ion beam may be incident on the source area 255A, which may therefore also have an increased effective length by the same factor wherein, however, the crystalline configuration may be significantly different compared to the mask material 220A and the gate electrode 251. For example, for a substantially standard crystallographic orientation of a silicon-based layer, the direction perpendicular to the surface of the layer 203 may represent a <100> crystallographic axis. By using a tilt angle on the order of magnitude of 45 degrees, however, a crystallographic <110> axis may be "seen" by the incoming ion beam, thereby providing enhanced penetration depth due to an increased channeling effect, as the respective axis potential of the <110> axis may be stronger compared to the potential of the <100> axis. Consequently, the increased effective length in the mask 220A, the gate electrode 251 and the source area 255A may result in a reduced probability of passing the entire thickness for the mask 220A and the gate electrode 251 while, nevertheless, an increased penetration depth, with respect to the vertical penetration depth, may be achieved in the source area 255A due to the difference in crystallographic configuration of the gate electrode 251 and the source area 255A.

Figure 2D:
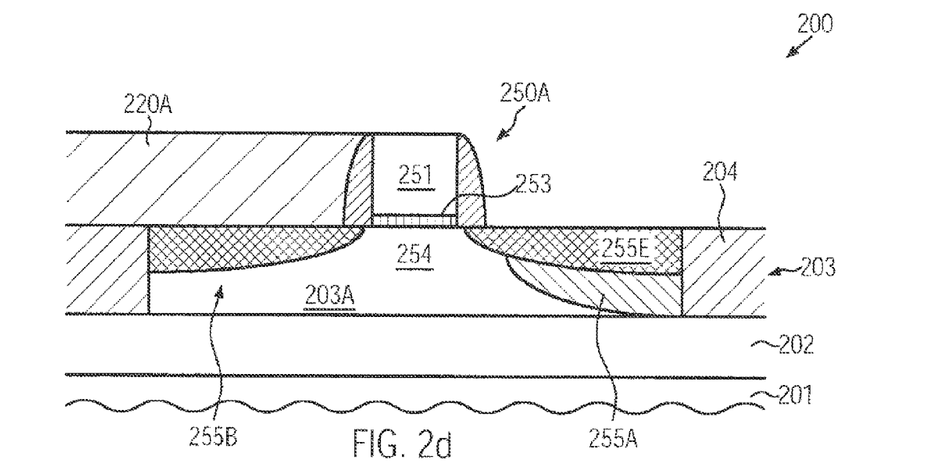

FIG. 2d schematically illustrates the device 200 after the implantation process 207A. Hence, a deep source region 255A may be formed which, in combination with the extension region 255E, may have the desired overall dopant profile. In other illustrative embodiments, in addition to the tilted implantation process, a substantially non-tilted implantation may be performed, however, at a reduced implantation energy when a more pronounced lateral and vertical dopant profile may be desired. Thus, the dopant profile in the source area 255A may be specifically designed in accordance with the requirements for the source area 255A, while the drain 255B may be configured in accordance with other criteria.

Figure 2E:
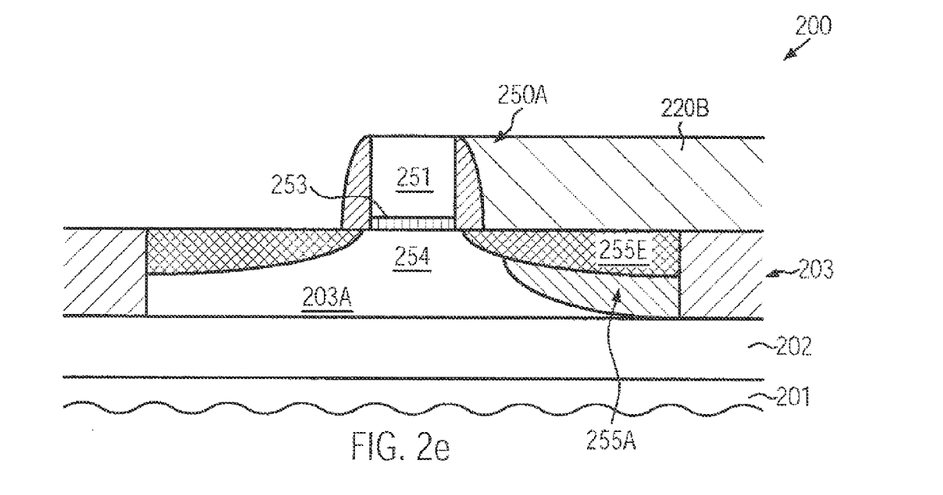

FIG. 2e schematically illustrates the device 200 after the removal of the mask 220A and with a further implantation mask 220B covering the source area 255A while exposing the drain area 255B. With respect to forming the resist mask 220B, the same criteria apply as previously explained with reference to the mask 220A.

Figure 2F:
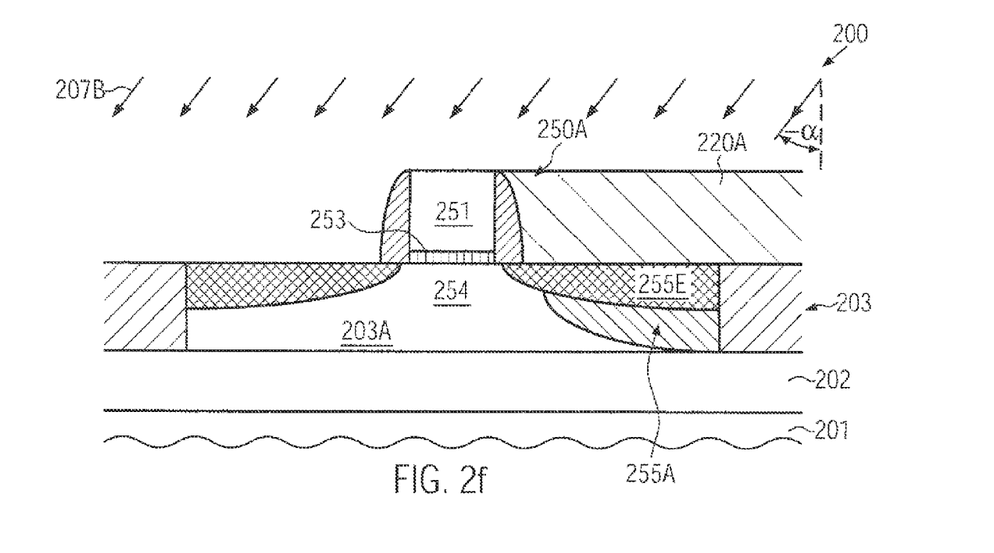

FIG. 2*f* schematically illustrates the device 200 during a further implantation process 207B which may include at least one implantation step performed by using a tilt angle of opposite sign, for instance a tilt angle of –α, if a substantially symmetric configuration for the drain and source areas 255A, 255B may be desired. In other cases, as previously explained, the tilt angle and/or the implantation parameters, such as energy and dose, may be individually adjusted in order to obtain the desired drain configuration. Thus, also in this case, significant doping of the channel region 254 may be avoided, while nevertheless providing a desired penetration depth in the drain area 255B.

Figure 2G:
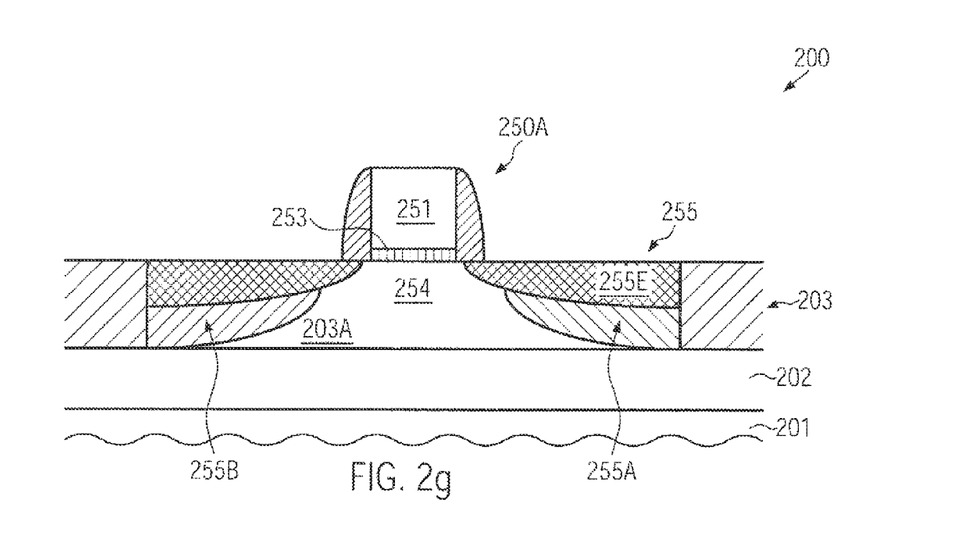

FIG. 2*g* schematically illustrates the device 200 after the implantation process 207B, which may also comprise additional implantation steps with a tilt angle of approximately zero degrees, if a further pronounced profiling of the drain area 255B may be required. As illustrated, the transistor 250A may comprise drain and source regions 255 with increased depth compared to conventional strategies, in which implantation energy of non-tilted implantation steps may have to be appropriately reduced to avoid undue channel doping. Furthermore, the lateral and vertical dopant profile in the drain and source regions 255 for the drain area 255B and the source area 255A may be individually adjusted, as previously explained, thereby further enhancing the overall performance of the transistor 250A. As previously explained, the concept of performing a tilted deep drain and source implantation process may be highly advantageous in the context of P-channel transistors, since, here, a pronounced variation of penetration depth may be observed. It should be appreciated, however, that the embodiments described above may also be applied to N-channel transistors, if required.

As a result, the present disclosure provides techniques for forming enhanced vertical dopant profiles of sophisticated transistor elements for adapting the ion blocking capability of a gate electrode structure without actually modifying the gate electrode prior to performing an implantation process for forming deep drain and source areas. In one illustrative aspect, this may be accomplished by removing material from the drain and source areas prior to the implantation process, which may be advantageously combined with the provision of a strain-inducing material, while, in other illustrative aspects, a tilted implantation process may be individually performed for the drain areas and the source areas to increase the effective length of the gate electrode structure that is "seen" by the incoming ion beam.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a drain mask above a drain region of a transistor so as to substantially completely cover said drain region and expose a source region;
   performing a source implantation process to implant a dopant species into said source region of said transistor by using said drain mask and a gate electrode as an implantation mask, said source implantation process comprising at least one implantation step using a first tilt angle selected to enhance a penetration depth of the dopant species on the basis of a crystallographic orientation of the source region;
   forming a source mask above said source region to substantially completely cover said source region and expose said drain region; and
   performing a drain implantation process to implant said dopant species into said drain region by using said source mask and said gate electrode as an implantation mask, said drain implantation process comprising at least one implantation step using a second tilt angle of opposite sign to the first tilt angle, the second tilt angle being selected to enhance a penetration depth of the dopant species on the basis of a crystallographic orientation of the drain region.

2. The method of claim 1, further comprising forming drain and source extension regions prior to forming said drain mask and said source mask.

3. The method of claim 2, wherein said drain and source extension regions are formed in a common process sequence.

4. The method of claim 2, further comprising forming a spacer element on sidewalls of said gate electrode prior to forming said drain mask and said source mask.

5. The method of claim 1, wherein a value of a maximum depth of at least one of said drain and source regions is approximately equal to or greater than a value of a height of said gate electrode.

6. The method of claim 1, wherein said drain and source implantation processes differ in at least one of an absolute amount of a tilt angle used in said drain and source implantation processes, a dose and an implantation energy.

7. The method of claim 1, comprising selecting the tilt angle for the source implantation process so that the dopant species sees a first crystallographic orientation in the source region that leads to an increased channeling effect for the dopant species, wherein the first crystallographic orientation differs from the second crystallographic orientation of the source region.

8. The method of claim 7, wherein the first crystallographic orientation seen by the incoming dopant species is <110> and the second crystallographic orientation is <100>, and wherein the first tilt angle is on the order of 45°.

9. The method of claim 1, comprising selecting the tilt angle for the drain implantation process so that the dopant species sees a first crystallographic orientation in the drain region that leads to an increased channeling effect for the dopant species, wherein the first crystallographic orientation differs from the second crystallographic orientation of the drain region.

10. The method of claim 9, wherein the first crystallographic orientation seen by the incoming dopant species is <110> and the second crystallographic orientation is <100>, and wherein the second tilt angle is on the order of –45°.

11. A method, comprising:
    forming drain and source extension regions in a semiconductor layer adjacent to a gate electrode structure of a P-channel transistor;
    forming cavities in said semiconductor layer laterally offset from said gate electrode to obtain a reduced thickness of said semiconductor layer in drain and source areas;
    introducing a P-type dopant into said drain and source areas of said semiconductor layer to form a deep drain region in a first implantation process and to form a deep source region in a second implantation process separate from said first implantation process, wherein the first and second implantation processes use said gate electrode as an implantation mask for substantially avoiding penetration of said P-type dopant into a channel region of said transistor; and refilling said cavities with a semiconductor material after introducing said P-type dopant for forming said deep drain and source regions.

12. The method of claim 11, wherein the first implantation process comprises selectively covering a drain area and introducing said P-type dopant species under a first tilt angle to form said deep source region and wherein the second implantation process comprises selectively covering a source area and introducing said P-type dopant under a second tilt angle to form said deep drain region, wherein the second tilt angle is different than the first tilt angle.

13. A semiconductor device formed by a process comprising:

forming a drain mask above a drain region of a transistor so as to substantially completely cover said drain region and expose a source region;

performing a source implantation process to implant a dopant species into said source region of said transistor by using said drain mask and a gate electrode as an implantation mask, said source implantation process comprising at least one implantation step using a first tilt angle selected to enhance a penetration depth of the dopant species on the basis of a crystallographic orientation of the source region;

forming a source mask above said source region to substantially completely cover said source region and expose said drain region; and performing a drain implantation process to implant said dopant species into said drain region by using said source mask and said gate electrode as an implantation mask, said drain implantation process comprising at least one implantation step using a second tilt angle of opposite sign to the first tilt angle, the second tilt angle being selected to enhance a penetration depth of the dopant species on the basis of a crystallographic orientation of the drain region.

14. The semiconductor device of claim 13 formed by a process comprising forming drain and source extension regions prior to forming said drain mask and said source mask.

15. The semiconductor device of claim 14 formed by a process wherein said drain and source extension regions are formed in a common process sequence.

16. The semiconductor device of claim 14 formed by a process comprising forming a spacer element on sidewalls of said gate electrode prior to forming said drain mask and said source mask.

17. The semiconductor device of claim 13 formed by a process wherein a value of a maximum depth of at least one of said drain and source regions is approximately equal to or greater than a value of a height of said gate electrode.

18. The semiconductor device of claim 13 formed by a process wherein said drain and source implantation processes differ in at least one of an absolute amount of a tilt angle used in said drain and source implantation processes, a dose and an implantation energy.

19. The semiconductor device of claim 13 formed by a process comprising selecting the tilt angle for the source implantation process so that the dopant species sees a first crystallographic orientation in the source region that leads to an increased channeling effect for the dopant species, wherein the first crystallographic orientation differs from the second crystallographic orientation of the source region.

20. The semiconductor device of claim 19, wherein the first crystallographic orientation seen by the incoming dopant species is <110> and the second crystallographic orientation is <100>, and wherein the first tilt angle is on the order of 45°.

21. The semiconductor device of claim 13 formed by a process comprising selecting the tilt angle for the drain implantation process so that the dopant species sees a first crystallographic orientation in the drain region that leads to an increased channeling effect for the dopant species, wherein the first crystallographic orientation differs from the second crystallographic orientation of the drain region.

22. The semiconductor device of claim 21, wherein the first crystallographic orientation seen by the incoming dopant species is <110> and the second crystallographic orientation is <100>, and wherein the second tilt angle is on the order of −45°.

* * * * *